United States Patent [19]
Leung et al.

[11] Patent Number: 5,136,171
[45] Date of Patent: Aug. 4, 1992

[54] CHARGE NEUTRALIZATION APPARATUS FOR ION IMPLANTATION SYSTEM

[75] Inventors: Ka-Ngo Leung, Hercules; Wulf B. Kunkel, Berkeley; Malcom D. Williams, Danville, all of Calif.; Charles M. McKenna, Boxford, Mass.

[73] Assignee: Varian Associates, Inc., Palo Alto, Calif.

[21] Appl. No.: 646,361

[22] Filed: Jan. 25, 1991

Related U.S. Application Data

[63] Continuation-in-part of Ser. No. 488,278, Mar. 2, 1990, abandoned.

[51] Int. Cl.$^5$ ............................................ H01J 37/317
[52] U.S. Cl. ............................... 250/492.2; 250/492.3; 250/398; 250/251
[58] Field of Search ............. 250/492.2, 492.21, 492.3, 250/398, 251; 335/210, 300

[56] References Cited

U.S. PATENT DOCUMENTS

| | | | |
|---|---|---|---|
| 3,305,810 | 2/1967 | Webb | 335/300 |
| 3,363,124 | 1/1968 | Bensussan et al. | 313/63 |
| 3,394,217 | 7/1968 | Fisk | 335/210 |
| 3,474,245 | 10/1969 | Kimura et al. | 250/397 |
| 3,507,709 | 4/1970 | Bower | 148/1.5 |
| 3,562,684 | 2/1971 | Sole | 335/300 |
| 3,622,782 | 11/1971 | Smith et al. | 250/307 |
| 3,676,672 | 7/1972 | Meckel et al. | 250/290 |
| 3,847,115 | 11/1974 | Tashbar | 118/49.1 |
| 4,076,558 | 2/1978 | Rupprecht et al. | 148/1.5 |
| 4,118,630 | 10/1978 | McKenna et al. | 250/492 A |
| 4,135,097 | 1/1979 | Forneris et al. | 250/492 B |
| 4,249,077 | 2/1981 | Crawford | 250/306 |
| 4,278,890 | 7/1981 | Gruen et al. | 250/492 B |
| 4,345,152 | 8/1982 | Gerlach | 250/396 ML |
| 4,361,762 | 11/1982 | Douglas | 250/251 |
| 4,463,255 | 7/1984 | Robertson et al. | 250/251 |
| 4,564,758 | 1/1986 | Slodzian et al. | 250/310 |
| 4,595,837 | 6/1986 | Wu et al. | 250/492.2 |
| 4,675,530 | 6/1987 | Rose et al. | 250/492.2 |
| 4,786,814 | 11/1988 | Kolondra et al. | 250/492.2 |
| 4,795,940 | 1/1989 | Leung et al. | 313/346 R |
| 4,804,837 | 2/1989 | Farley | 250/251 |
| 4,806,829 | 2/1989 | Nakao | 315/111.81 |
| 4,825,087 | 4/1989 | Renau et al. | 250/423 R |
| 4,939,360 | 7/1990 | Sakai | 250/398 |

FOREIGN PATENT DOCUMENTS 54-124879  9/1979  Japan .

Primary Examiner—Jack I. Berman
Attorney, Agent, or Firm—Sheri M. Novack

[57] ABSTRACT

Methods and apparatus for neutralization of a workpiece such as a semiconductor wafer in a system wherein a beam of positive ions is applied to the workpiece. The apparatus includes an electron source for generating an electron beam and a magnetic assembly for generating a magnetic field for guiding the electron beam to the workpiece. The electron beam path preferably includes a first section between the electron source and the ion beam and a second section which is coincident with the ion beam. The magnetic assembly generates an axial component of magnetic field along the electron beam path. The magnetic assembly also generates a transverse component of the magnetic field in an elbow region between the first and second sections of the electron beam path. The electron source preferably includes a large area lanthanum hexaboride cathode and an extraction grid positioned in close proximity to the cathode. The apparatus provides a high current, low energy electron beam for neutralizing charge buildup on the workpiece.

48 Claims, 13 Drawing Sheets

TRANSPORT VOLTAGE - 54 VOLTS
BACKGROUND GAS - XENON @ $5 \times 10^{-5}$ TORR

TRANSPORT VOLTAGE 30.8 VOLTS, TRANSPORT FIELD 32 GAUSS, STEERING FIELD 5 GAUSS, TOTAL CURRENT 96.2 mA.

CHARGE NEUTRALIZATION APPARATUS FOR ION IMPLANTATION SYSTEM

GOVERNMENT RIGHTS

The Government has rights in this invention under Contract No. DE-AC03-76SF00098.

CROSS REFERENCE TO RELATED APPLICATION

This application is a continuation-in-part of application Ser. No. 07/488,278, filed Mar. 2, 1990, now abandoned.

FIELD OF THE INVENTION

This invention relates to treatment of workpieces with a beam of positive ions and, more particularly, to methods and apparatus for neutralizing charge buildup on the workpiece which is caused by the beam of positive ions. The charge neutralization methods and apparatus of the invention are intended primarily for use in ion implantation of semiconductor wafers, but are not limited to such use.

BACKGROUND OF THE INVENTION

Ion implantation has become a standard, commercially-accepted technique for introducing conductivity-altering impurities into semiconductor wafers. A desired impurity material is ionized in an ion source, the ions are accelerated to form an ion beam of prescribed energy, and the ion beam is directed at the surface of the wafre. The energetic ions in the beam penetrate into the bulk of the semiconductor material and are embedded in the crystalline lattice of the semiconductor material to form a region of desired conductivity. Other processes, including ion beam milling and reactive ion etching, also involve the application of ion beams to semiconductor wafers.

The ion beam utilized in iion implantation and in other ion beam processes is usually a beam of positive ions. The positive ions cause a buildup of positive electrical charges on the workpiece. When the workpiece is conductive, the electrical charges can be removed by electrically connecting the workpiece to a suitable potential, such as ground. However, in the case of nonconducting and low conductivity workpieces such as semiconductor wafers, the positive charges remain on the workpiece and increase in number as the ion beam is applied. Depending on the ion beam current, the duration of the ion implant and the conductivity of the workpiece, a substantial positive potential can build up on the workpiece. Such a potential can damage the highly-sensitive, microminiature devices on semiconductor wafers. Thus, it is important to provide a means for limiting the charge buildup which occurs during ion implantation and other ion beam processes.

Various techniques for neutralization of workpieces during implantation have been disclosed in the prior art. A low energy electron beam directed at a semiconductor device to effect neutralization is disclosed in U.S. Pat. No. 3,507,709, issued Apr. 21, 1970 to Bower. The electron beam carries a negative charge which at least partially offsets or neutralizes the positive charge introduced by the ion beam. This technique is commonly known as electron flooding. The electron beam is produced by a heated filament. One drawback of the disclosed arrangement is contamination of the workpiece by material emitted from the filament. In addition, undesired heating of the workpiece is caused by the heated filament.

Apparatus for neutralizing the potential on a workpiece by directing electrons from a filament into the ion beam is disclosed in U.S. Pat. No. 4,118,630, issued Oct. 3, 1978 to McKenna et al, and U.S. Pat. No. 4,135,097, issued Jan. 16, 1979 to Forneris et al. The disclosed apparatus avoids a direct line of sight between the electron-generating filament and the workpiece. According to these patents, electrons are trapped in the ion beam and are carried with the positive ions to the workpiece. In the disclosed technique, the electrons have relatively high energies and may not be efficiently transported to the workpiece.

A neutralizatoin apparatus wherein a primary electron beam is directed through the ion beam at a secondary electron target positioned adjacent to the ion beam is disclosed in U.S. Pat. No. 4,463,255, issued July 31, 1984 to Robertson et al. Secondary electrons which are stimulated by the primary electron bean have low energies and are efficiently entrapped within the ion beam.

A charge suppressing device which utilizes a magnet for deflecting an electron beam is disclosed in U.S. Pat. No. 4,939,360, issued Jul. 3, 1990 to Sakai. The magnetic field is oriented at an angle to the initial direction of the electron beam and affects the electron beam over a limited portion of the electron beam path.

A flood gun for introducing low energy electrons into an ion beam for neutralizing charge buildup on a semiconductor wafer is disclosed in U.S. Pat. No. 4,825,087, issued Apr. 25, 1989 to Renau et al.

A device for the ionic analysis of an insulating sample wherein the surface of the sample is bombarded by a primary electron beam is disclosed in U.S. Pat. No. 4,564,758, issued Jan. 14, 1986 to Slodzian et al. Negative ions emitted by the sample are used for producing an ion image of the sample. An electron beam whose normal speed component reaches zero at the surface of the sample is directed perpendicularly to the sample through a magnetic prism.

Other techniques for ion beam neutralization are disclosed in U.S. Pat. No. 4,278,890 issued Jul. 14, 1981 to Gruen et al, U.S. Pat. No. 3,622,782 issued Nov. 23, 1971 to Smith et al, U.S. Pat. No. 3,847,115 issued Nov. 12, 1974 to Tashbar and Japanese Patent No. 54-124879 dated Sept. 1979. The neutralization of a target that is irradiated by an electron beam with low energy positive ions is disclosed in U.S. Pat. No. 4,249,077 issued Feb. 3, 1981 to Crawford. A neutralized ion beam propulsion device is disclosed in U.S. Pat. No. 3,363,124 issued Jan. 9, 1968 to Bensussan et al. A scanning electron microscope wherein secondary electrons emitted from a specimen are guided to a detector by a solenoid coil, is disclosed in U.S. Pat. No. 3,474,245, issued Oct. 21, 1969 to Kimura et al.

All of the known prior art techniques for neutralization of workpieces have had one or more disadvantages, including contamination of the workpiece by the electron source, damage to the workpiece by energetic electrons, lack of control over electron energies, insufficient electron beam current to neutralize the workpiece and nonuniform distribution of neutralizing electrons over the surface of the workpiece.

It is a general object of the present invention to provide improved methods and apparatus for ion beam treatment of workpieces.

It is another object of the present invention to provide improved methods and apparatus for neutralization of workpieces in ion beam systems.

It is a further object of the present invention to provide methods and apparatus for directing a high current, low energy electron beam at a semiconductor wafer.

It is yet another object of the present invention to provide charge neutralization methods and apparatus wherein an electron beam is magnetically guided from an electron source to a workpiece.

It is still another object of the present invention to provide methods and apparatus for charge neutralization which minimize contamination of the workpiece.

It is a further object of the invention to provide charge neutralization methods and apparatus wherein electron energies are sufficiently low to avoid damage to the workpiece.

It is another object of the invention to provide charge neutralization methods and apparatus wherein electrons are substantially uniformly distributed over the workpiece surface.

It is a further object of the present invention to provide an ion implantation system including an electron source that is remotely located from the ion beam and means for efficiently transporting a high current, low energy electron beam from the electron source to a target.

It is still another object of the present invention to provide charge neutralization methods and apparatus in ion beam systems wherein an electron source can be repaired or replaced without interrupting the vacuum in the region of the ion beam.

SUMMARY OF THE INVENTION

According to the present invention, these and other objects and advantages are achieved in methods and apparatus for neutralization of a workpiece in a system wherein a beam of positive ions is applied to the workpiece. The apparatus comprises an electron source for generating an electron beam and magnetic means for generating a magnetic field along a prescribed electron beam path between the electron source and the workpiece for guiding the elctron beam to the workpiece. The ion beam path and the electron beam path are maintained at high vacuum during operation. The apparatus is typically utilized in a system for ion implantation of semiconductor wafers. However, the apparatus is not limited to such use.

The electron source can be positioned adjacent to the ion beam or can be positioned remotely from the ion beam. In a preferred embodiment, the electron source is positioned remotely from the ion beam such that it can be isolated from the main vacuum chamber which encloses the ion beam and the workpiece. This configuration permits servicing of the electron source without interrupting the vacuum in the main vacuum chamber. Remote location of the electron source also reduces the risk that heat and contaminants from the electron source will reach the workpiece.

The electron beam path includes a first section which extends between the electron source and the ion beam and a second section that is coincident with the ion beam. In the second section, the electron beam and the ion beam travel together toward the workpiece. The electron beam can intersect the ion beam at an angle in the range from slightly greater than 0° to slightly less than 180°. Preferably, the electron beam intersects the ion beam at an angle in the range of about 90° to slightly less than 180°, thereby reducing the risk that contaminants and heat from the electron source will reach the workpiece. In an elbow region between the first and second sections of the electron beam path, the electron beam curves through an angle corresponding to the angle of intersection of the electron beam and the ion beam.

The magnetic means typically includes means for generating an axial component of the magnetic field generally parallel to the electron beam path, and means for generating a transverse component of the magnetic field in the elbow region. The transverse component is perpendicular to the electron beam path. The axial component extends along substantially the entire length of the electron beam path from the electron source to the workpiece. The magnetic field permits a high current, low energy electron beam to be transported from a remote electron source to the workpiece.

In a preferred embodiment, the means for generating an axial component of the magnetic field comprises a steering coil including a generally helical conductor surrounding the electron beam. The steering coil includes a first section extending between the electron source and the ion beam, a second section extending to the region of the workpiece and an elbow section joining the first and second sections. The steering coil has an opening in the elbow section for receiving the ion beam. The electron beam and the ion beam are coincident in the second section and are surrounded by the second section of the steering coil. The axial component of the magnetic field is curved in the elbow section. The means for generating a transverse component of the magnetic field preferably comprises coil means, such as Helmholtz coils, positioned above and below the elbow region where the axial component of the magnetic field is curved.

The electron source preferably includes a large are cathode and means for extracting low energy electrons from the cathode. Preferably, the electrons in the electron beam have energies of 30 electron volts or less. In a preferred embodiment, the cathode comprises lanthanum hexaboride ($LaB_6$). The means for extracting electrons can comprise an extraction grid positioned in close proximity to the cathode and means for applying an extraction voltage to the extraction grid. The cathode has sufficient area to provide a substantially uniform distribution of electrons over the workpiece.

According to another aspect of the invention, there is provided a method for neutralization of a workpiece in a system wherein a beam of positive ions applied to the workpiece. The method comprises the steps of generating an electron beam with an electron source and generating a magnetic field along a prescribed electron beam path between the electron source and the workpiece for guiding the electron beam to the workpiece.

According to a further aspect of the invention, the neutralization apparatus includes means for cooling the magnetic means. The cooling means absorbs thermal energy radiated from the electron source and acts as a getter for contaminants generated by the electron source and by the magnetic means.

As described above, the magnetic means typically comprises a steering coil including a generally helical conductor surrounding the electron beam. The steering coil preferably comprises a tublar conductor. The cooling means preferably includes means for circulating a cooling fluid through the tubular conductor and can further include a nonmagnetic tube located within the steering coil and theremally connected tot he steering coil.

A Faraday charge measurement system can be positioned in front of the workpiece such that the ion beam pases through the Faraday system to the workpiece. In this configuration, the electron beam from the electron source is directed into the Faraday charge measurement system. A nonmagnetic tube extends from a region adjacent to the electron source to an opening in the Faraday charge measurment system. A first section of the steering coil surrounds the nonmagnetic tube, and a second section of the steering coil surrounds the Faraday charge measurement system. The electron beam is magnetically guided into the Faraday system and then is magnetically guided through the Faraday system to the workpiece.

BRIEF DESCRIPTION OF THE DRAWINGS

For the better understanding of the present invention, together with other and further objects, advantages and capabilities therefore, reference is made to the accompanying drawings which are incorporated herein by reference and in which.

DETAILED DESCRIPTION OF THE INVENTION

Figure 1:
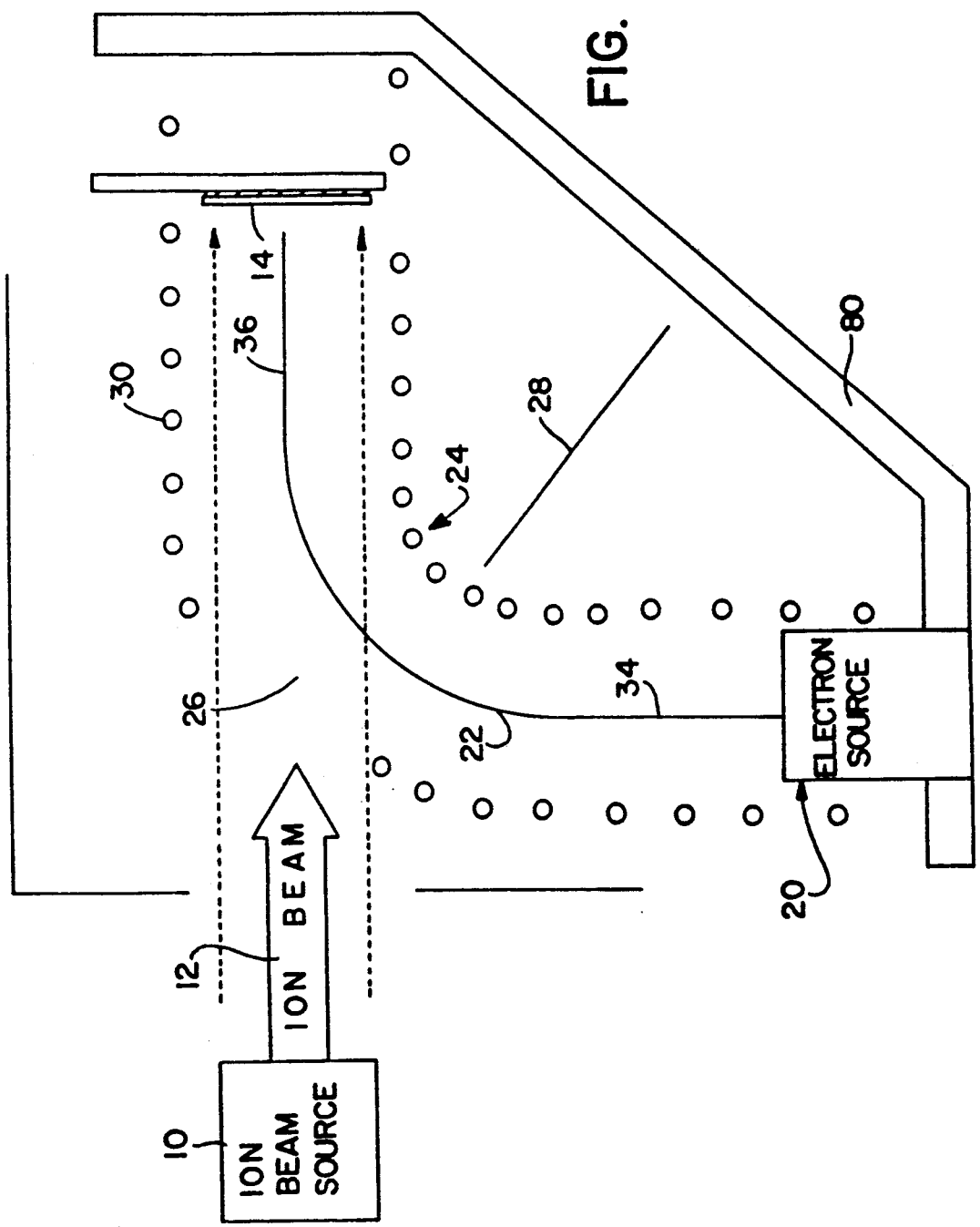
FIG. 1 is a schematic diagram of an ion implantation system which incorporates charge neutralization apparatus in accordance with the present invention.

A schematic diagram of an ion implantation system which incorporates charge neutralization apparatus in accordance with the present invention is shown in FIG. 1. An ion beam source 10 directs an ion beam 12 toward a workpiece 14 such as a semiconductor wafer. The ion beam 12 is a beam of positive ions. The ion beam source 10 in a typical ion implantation system includes an ion source, an ion accelerator for accelerating the ion beam to an energy typically in the range of 10–400 KeV, and a mass analyzer for removing unwanted ion species. The current in ion beam 12 may be in the range of 10 to 50 milliamps in the case of batch ion implantation systems. The ion implantation system typically further includes means for scanning the ion beam 12 relative to the wafer 14. Scanning may be electrostatic, magnetic, mechanical or a combination of scanning techniques. The ion implantation system typically further includes means for holding the wafer 14 in a target position, means for exchanging wafers and may include means for cooling of the wafer 14 during ion implantation. The entire region between the ion source and the wafer 14 is maintained at high vacuum during ion implantation. A variety of different ion implantation systems are known in the art and are commercially available.

The charge neutralization apparatus of the present invention includes an electron source 20 for generating an electron beam 22 and magnetic means 24 for generating a magnetic field along a prescribed electron beam path between the electron source 20 and the wafer 14. The magnetic field guides the electron beam 22 along the electron beam path from the electron source 20 to the wafer 14. The magnetic field is relatively weak so that the perturbation of the trajectories of positive ions in ion beam 12 is very small. As sescribed in detail hereinafter, the magnetic means 24 typically ihncludes at least a steering coil 30 which extends from the electron source 20 to the wafer 14 and which generates an axial magnetic field along substantially the entire length of the prescribed electron beam path. The electron source 20 can be positioned adjacent to the ion beam 12 or can be positioned remotely from the ion beam 12. As discussed below, remote positioning of the electron source 20 provides a number of advantages in a practical ion implantation system.

The electron source 20 is positioned so that the electron beam 22 is initially directed toward the ion beam 12. In the example of FIG. 1, the electron beam 22 is initially directed toward the ion beam 12 at an angle of 90° and intersects the ion beam 12 at approximately 90°. As discussed below, the electron beam 22 can intersect the ion beam 12 at angles different from 90°. It will be understood that the angle of intersection between electron beam 22 and ion beam 12 is an approximation, since the electron beam 22 follows a curved path from its initial direction as emitted from the electron source 22 to its final direction parallel to the ion beam 12.

The electron beam 22 intersects the ion beam 12 in a region 26, is bent through an angle of approximately 90° in the example of FIG. 1 and then is guided along the same path as ion beam 12 to wafer 14. The path followed by electron beam 22 includes a first portion 34 that is generally perpendicular to ion beam 12 and a second portion 36 that is coincident with ion beam 12. The electron beam 22 and the ion beam 12 are incident upon wafer 14 at the same angle. While the wafer 14 is typically perpendicular to the ion beam 12, it is known in the art to tilt the wafer 14 at a prescribed angle relative to the ion beam 12 to reduce ion channeling in the crystal structure of the semiconductor material. A baffle 28 can be used to prevent a direct line of sight between electron source 20 and wafer 14.

The electron beam 22 neutralizes positive charges imparted to the wafer 14 by ion beam 12. As described hereinafter, the electron beam 22 has low energy, has high current to insure neutralization even when high current ion beams are used, and is evenly distributed over wafer 14. When used with a Faraday charge measurement system, all parts of the charge neutralization apparatus, including power supplies, must be referenced to the Faraday system to prevent dose measurement errors.

Figure 2:
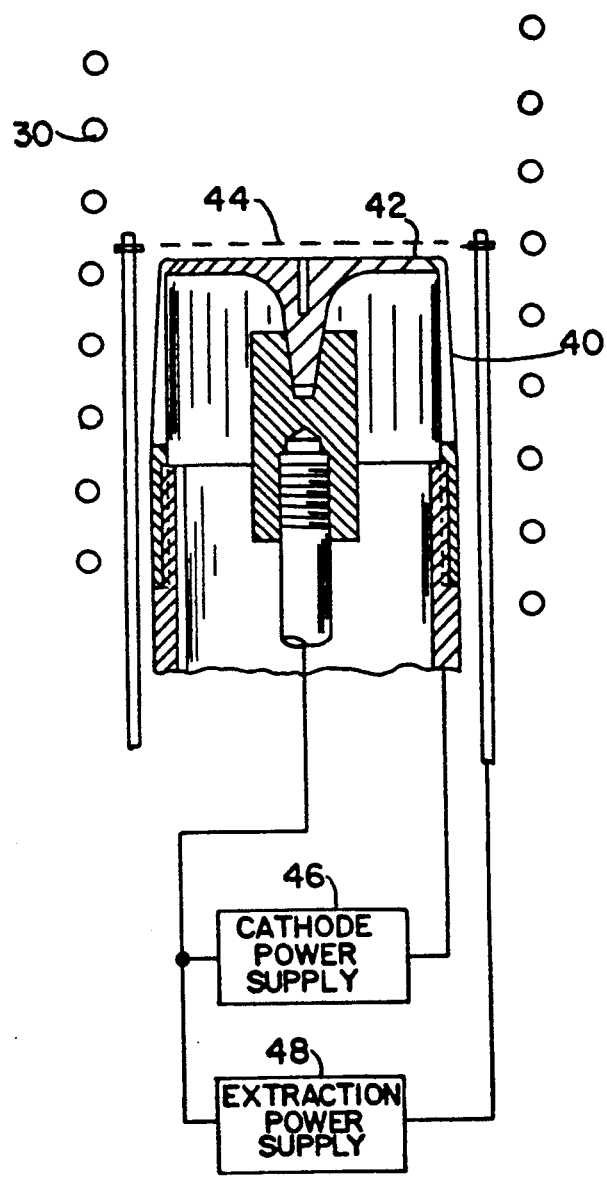
FIG. 2 is an enlarged and simplified top view of the electron source used in the charge neutralization apparatus of FIG. 1.

The electron source 20 is preferably a type which generates a large area, low energy electron beam 22. The cross-sectional area of the electron beam 22 is preferably approximately equal to the area of wafer 14. The electron energies are preferably 30 electrons volts or less. A preferred embodiment of electron source 20 is shown in FIG. 2. The source includes a large area, directly-heated cathode 40 having a flat emission surface 42 and an extraction grid 44 positioned in front of emission surface 42. The cathode 40 is directly heated by a cathode power supply 46. The extraction grid 44 is energized by an extraction power supply 48 connected between the extraction grid 44 and the cathode 40. The cathode 40 is preferably a lanthanum hexaboride (LaB$_6$) coaxial cathode structure as disclosed in U.S. Pat. No. 4,795,940, issued Jan. 3, 1989 to Leung et al, which is hereby incorporated by reference. In the coaxial structure, the magnetic field generated by the cathode heater current is cancelled, thereby permitting low energy electrons to leave the cathode.

In an example of the electron source 20, the extraction grid 44 is a tungsten wire mesh with 74% transparency positioned approximately 2 millimeters from the emission surface 42 and biased in the range of +15 to +50 volts relative to cathode 40. The emission surface 42 in the present example has a diameter on the order of 5 centimeters.

Lanthanum hexaboride is chosen as a cathode material because it has a high melting point, chemical inertness and resistance to erosion under ion bombardment. Lanthanum hexaboride has a high emission current density at temperatures of 1600° K. or higher, and has a very low evaporation rate. A lanthanum hexaboride cathode having a diameter of 5 centimeters can generate an electron current of about 100 milliamps when operated at a temperature of about 1400° K.

Figure 3:
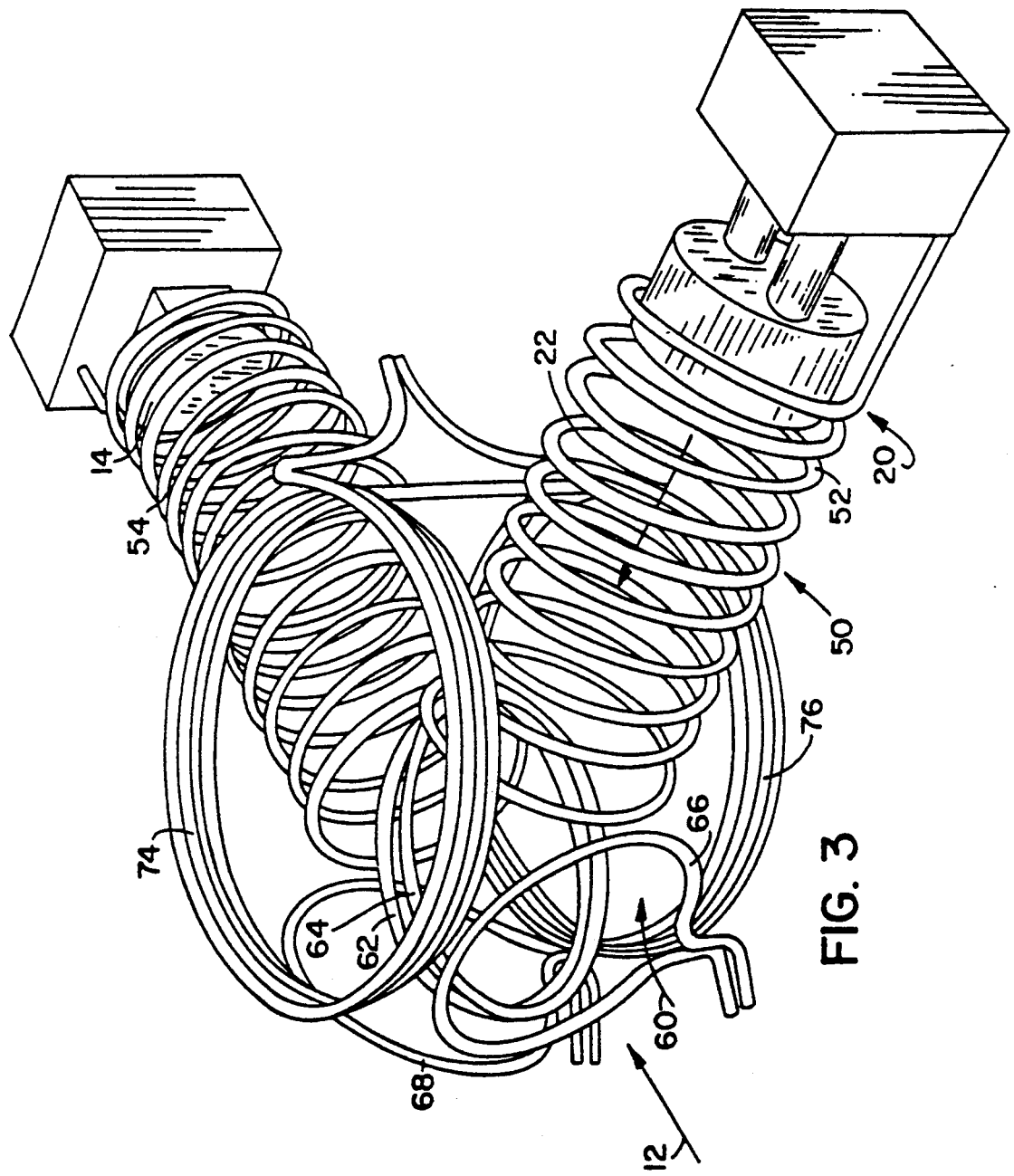
FIG. 3 is a perspective view of an example of the charge neutralization apparatus of the invention.

An example of the magnetic means 24 for guiding the electron beam 22 to the wafer 14 is shown in FIG. 3. The direction of the magnetic fields is shown schematically in FIG. 4. The electron source can be the same as the electron source 20 shown in FIGS. 1 and 2 and described hereinabove. The magnetic means 24 includes a generally helical steering coil 50 having a first section 52 which extends between electron source 20 and the path of ion beam 12 and a second section 54 which extends to a region adjacent to wafer 14. The first section 52 is generally perpendicular to the second section 54 in this example. The steering coil sections 52 and 54 intersect in an elbow region 56. The electron beam 22 and the ion beam 12 also intersect in the elbow region 56. The steering coil 50 generates an axial magnetic field along the prescribed electron beam path.

The first steering coil section 52 has a sufficiently large diameter to surround and provide clearance for the electron beam 22. The steering coil section 54 has a sufficiently large diameter to surround and provide clearance for the electron beam 22 and the ion beam 12. For a cathode emission surface 42 having a diameter of 5 centimeters, a steering coil 50 having a diameter of 8.9 centimeters provides the required magnetic field and the required clearance. In an example of the steering coil 50 for a 5 centimeter diameter electron beam, the steering coil 50 was fabricated of ¼ inch diameter copper tubing and has a 2-3 centimeter spacing between turns. Cooling water was circulated through the copper tubing of steering coil 50.

The elbow region 56 of magnetic means 24 must meet several requirements. Since the electron beam 22 merges with the ion beam 12 in elbow region 56, the magnetic means 24 must have an aperture four receiving the ion beam 12. The steering coil 50 may make a sharp turn in elbow region 56, depending on the angle of intersection between electron beam 22 and ion beam 12. The magnetic field generated by the magnetic means 24 must guide the electron beam 22 from steering coil section 52, through the turn in elbow region 56 and into steering coil section 54.

Figure 4:
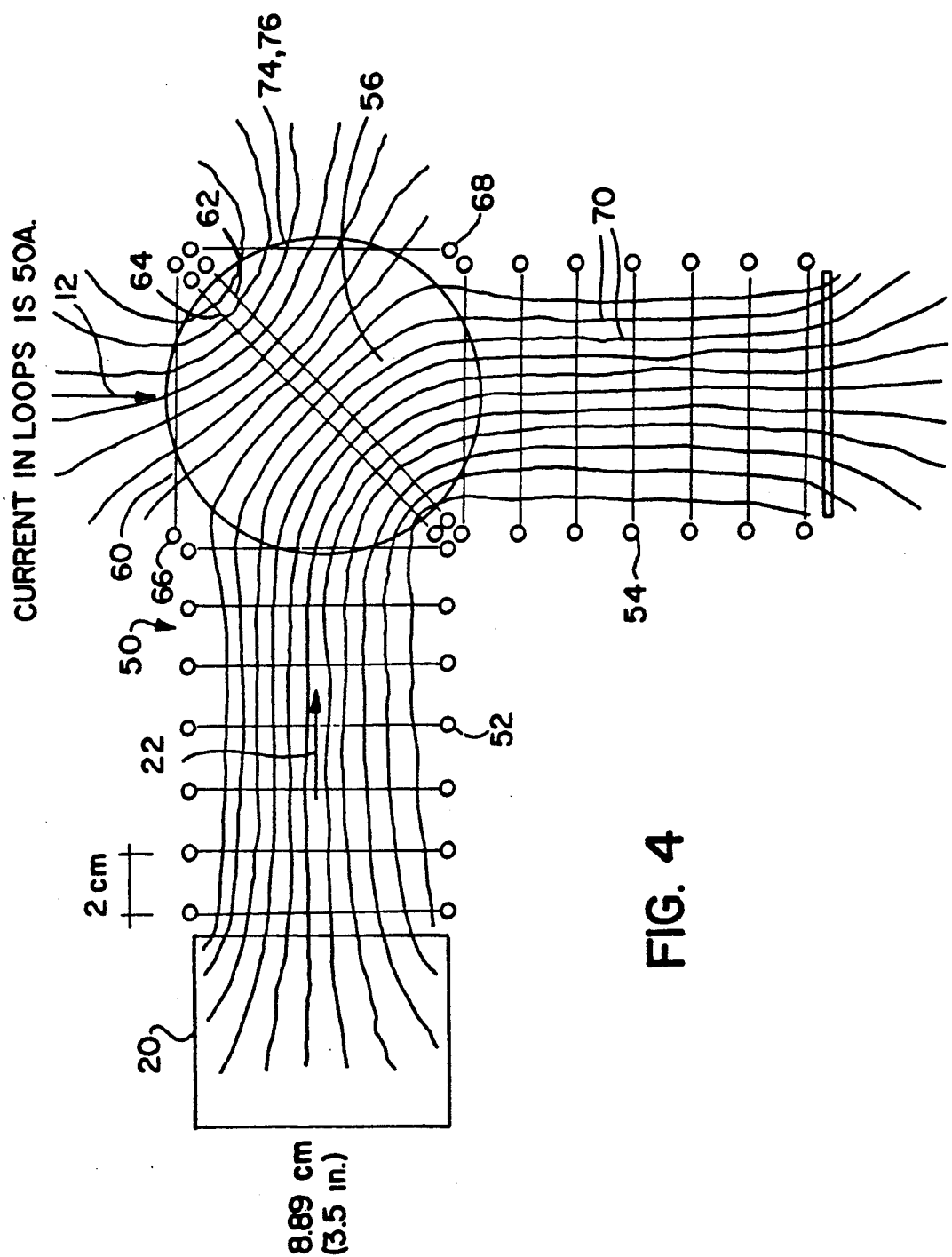
FIG. 4 is a schematic diagram which illustrates the magnetic field lines in the charge neutralization apparatus of FIG. 3.

Referring again to FIG. 3, an aperture 60 is provided in elbow region 56 of steering coil 50 for receiving the ion beam 12. Turns 62 and 64 of steering coil 50 are oriented at 45° with respect to ion beam 12 to provide a transition between steering coil section 52 and steering coil section 54. In addition, a separated trim coil 66 is positioned with its plane perpendicular to ion beam 12 so as to define aperture 60 where ion beam 12 enters elbow region 56. A separate trim coil 68 is positioned with its plane parallel to the direction of ion beam 12 and is located on the opposite side of ion beam 12 from steering coil section 52. The trim coils 66 and 68 produce magnetic fields which adjust the magnetic field generated by steering coil 50 so that the axial magnetic field undergoes a smooth transition through elbow region 56 and the electron beam 22 is guided from steering coil section 52 to steering coil section 54. The resultant axial magnetic field is indicated in FIG. 4 by field lines 70. The field lines 70 change direction by approximately 90° in elbow region 56 so that the electron beam 22, which is initially perpendicular to ion beam 12, is guided into a path coincident with ion beam 12 and travels with ion beam 12 to wafer 14.

The magnetic means 24 further includes a coil 74 positioned above elbow region 56 and a coil 76 positioned below elbow region 56. The coils 74 and 76 comprise a Helmholtz coil which produces a generally uniform, transverse magnetic field in the region between the coils. The direction of the transverse magnetic field is perpendicular to the axial magnetic field produced by steering coil 50 and is perpendicular to the plane of electron beam 22. Thus, the total magnetic field produced by magnetic means 24 includes an axial component produced by coils 50, 66 and 68 and a transverse component produced by coils 74 and 76. The axial component extends from the electron source 20 to wafer 14 along the path of electron beam 22. The axial component of the magnetic field is less than 100 gauss and is typically on the order of about 30 gauss. The transverse component is required only in elbow region 56.

It was found that in the absence of coils 74 and 76, the electron beam 22, upon reaching elbow region 56, drifts out of the path to wafer 14 and only a small electron current reaches wafer 14. The drift is caused by the curvature of the axial component of magnetic field in the elbow region 56. The transverse component of the magnetic field produced by coils 74 and 76 effectively steers the electron beam 22 toward wafer 14. The magnitude of the transverse magnetic field component produced by coils 74 and 76 depends on the energy of electrons in beam 22. Generally, the transverse component of magnetic field can be weaker than the axial magnetic field component produced by steering coil 50. In the example shown in FIG. 3 and described above, the coils 74 and 76 each had a diameter of 22.5 centimeters, 4 turns and a current in the range of 10 to 30 amps. The coils 74 and 76 were separated by 15 centimeters.

Figure 3A:
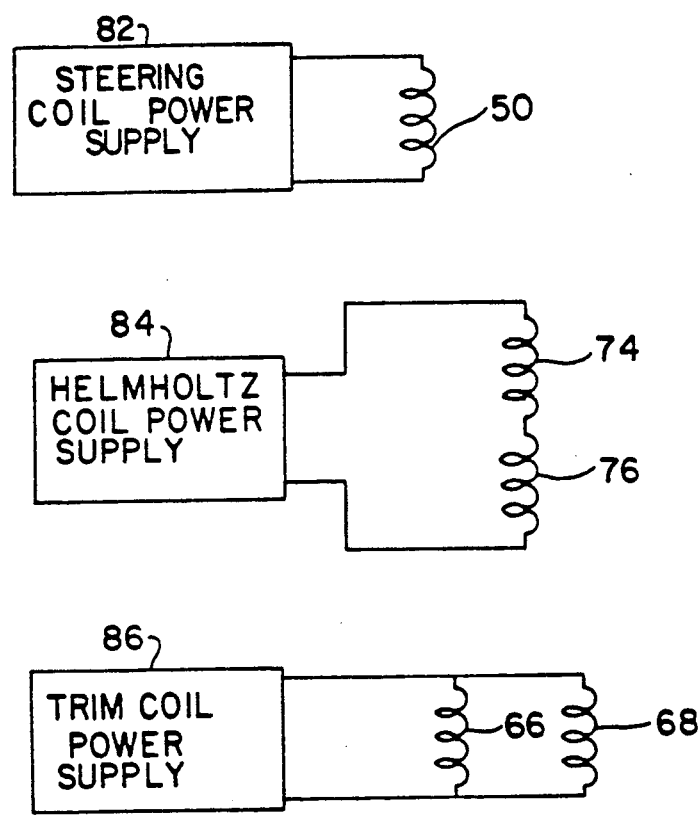
FIG. 3A is a schematic diagram which illustrates the power supplies for the coiles shown in FIG. 3.

As shown in FIG. 1, the magnetic means 24 can further include a magnetically permeable yoke 80 which extends from the region of electron source 20 to wafer 14 and which provides a return path for the axial magnetic field lines that extend between source 20 and wafer 14. Power supplies for energizing the magnetic means 24 are shown in FIG. 3A. A steering coil power supply 82 is connected to steering coil 50. A Helmholtz coil power supply 84 is connected to a series connection of coils 74 and 76. A trim coil power supply 86 is connected to a parallel connection of trim coils 66 and 68. Typical magnetic field strengths are discussed hereinafter. The current and voltage levels of the power supplies 82, 84, 86 are selected to provide the required magnetic fields.

Figure 5:
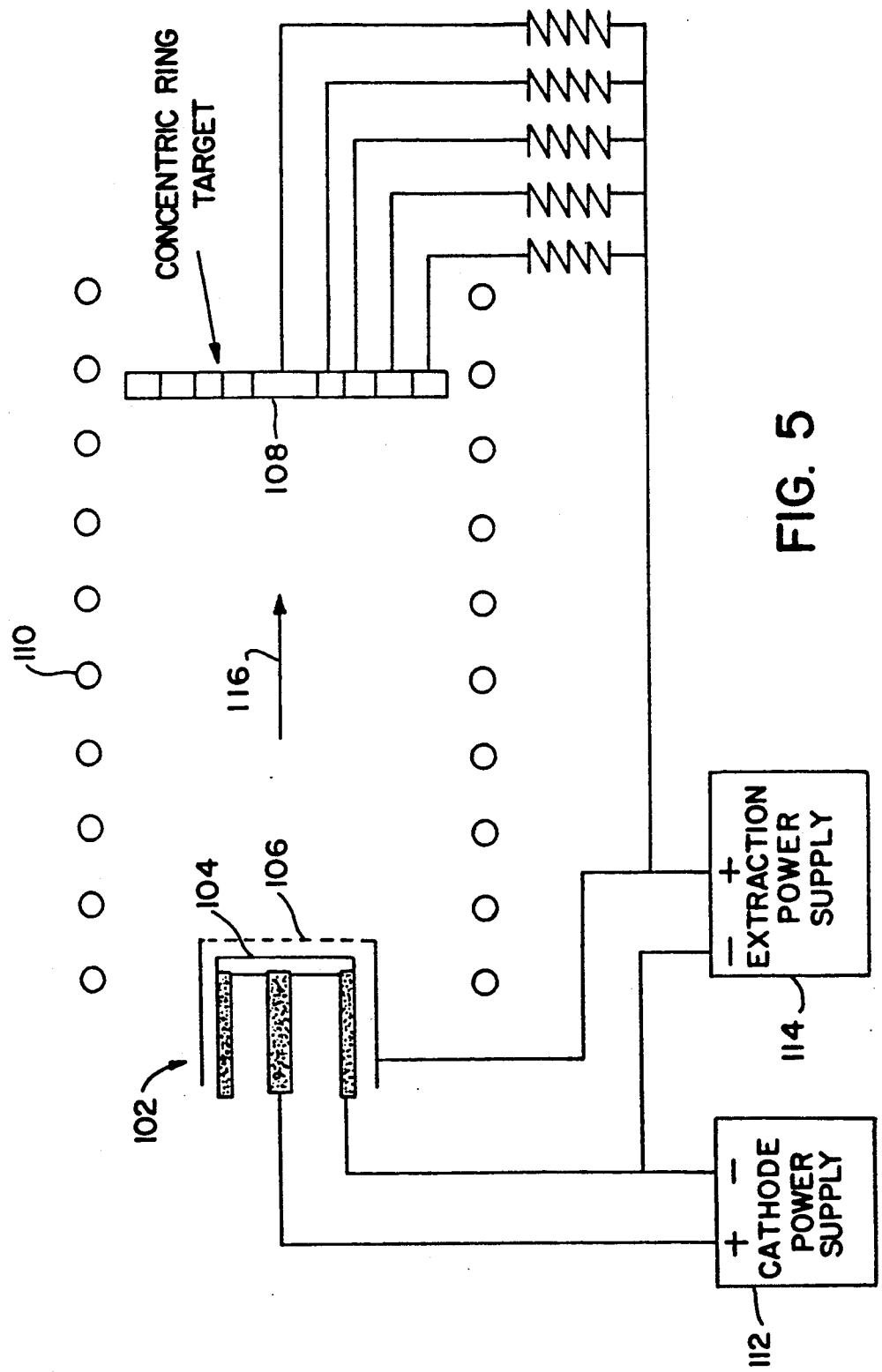
FIG. 5 is a schematic diagram of an experimental charge neutralization apparatus in accordance with the invention.

A simplified version of the charge neutralization apparatus was constructed as shown in FIG. 5. An electron source 102 including a large area cathode 104 and an extraction grid 106 was directed along a straight path at a target 108. The target 108 included concentric, segmented copper rings which permit measurement of electron current at different radial distances from the center of the target 108. A helical steering coil 110 extended from the electron source 102 to the target 108. A cathode power supply 112 was connected to cathode 104, and an extraction power supply 114 was connected between cathode 104 and extraction grid 106. A current in steering coil 110 of approximately 60 amps provided a magnetic field of approximately 30 gauss, which was found adequate to transport a low energy electron beam 116 to target 108. The apparatus of FIG. 5 was operated in a vacuum chamber.

Figure 6:
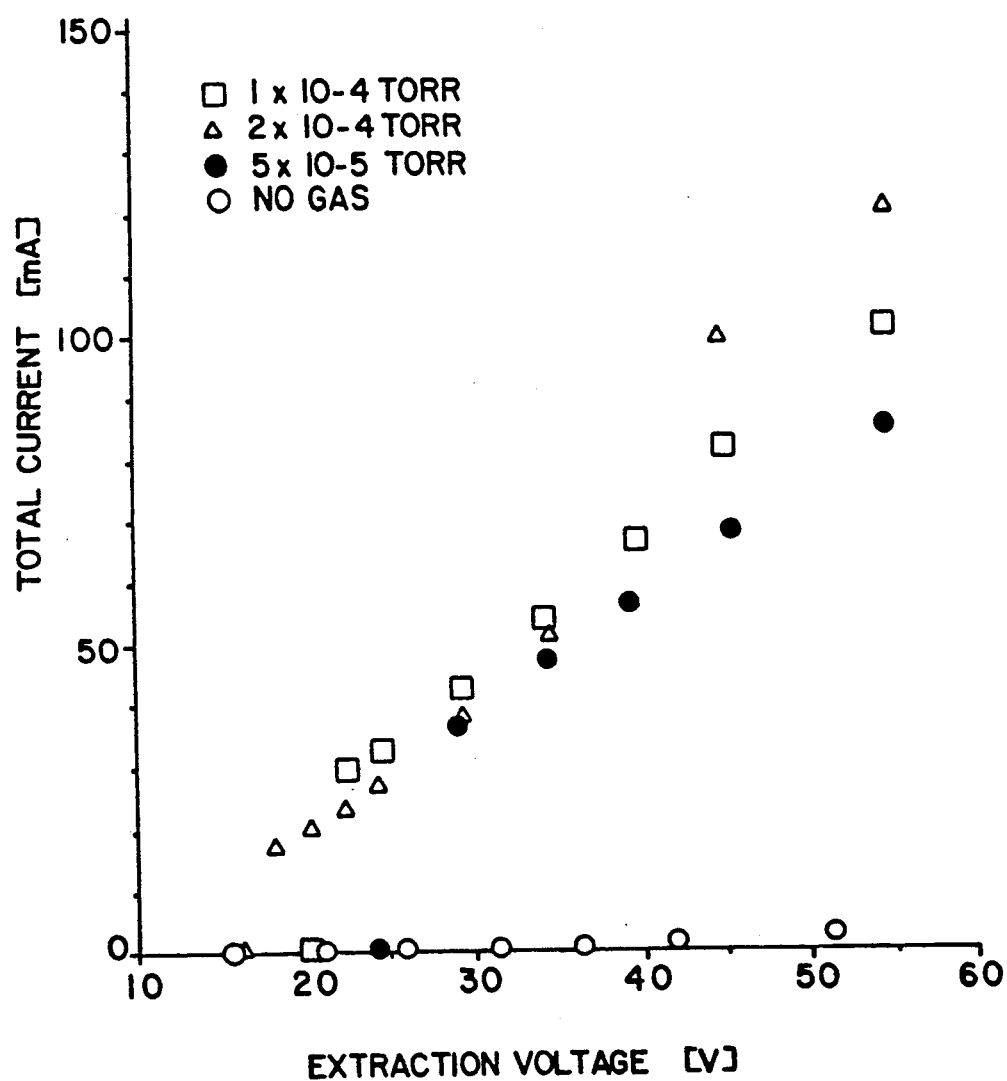
FIG. 6 is a graph of electron current as a function of extraction voltage for different background gas pressures in the apparatus of FIG. 5.

The total current collected by target 108 is plotted in FIG. 6 as a function of the extraction voltage between extraction grid 106 and cathode 104 for several background gas pressures. For a gas pressure of about $1 \times 10^{-6}$ torr, an electron current of only about 3 milliamps was transported to target 108. When a small quantity of xenon gas was added to the chamber, the electron current increased rapidly. As shown in FIG. 6, an electron current of about 100 milliamps is obtained with an extraction voltage of 55 volts and xenon pressure of $1 \times 10^{-4}$ torr. This indicates that positive ions are required for a space charge neutralization. Positive xenon ions are produced by the beam electrons when the extraction voltage is greater than the ionization potential of xenon. In an ion implantation system, the required positive ions are provided by the ion beam 12.

Figure 7:
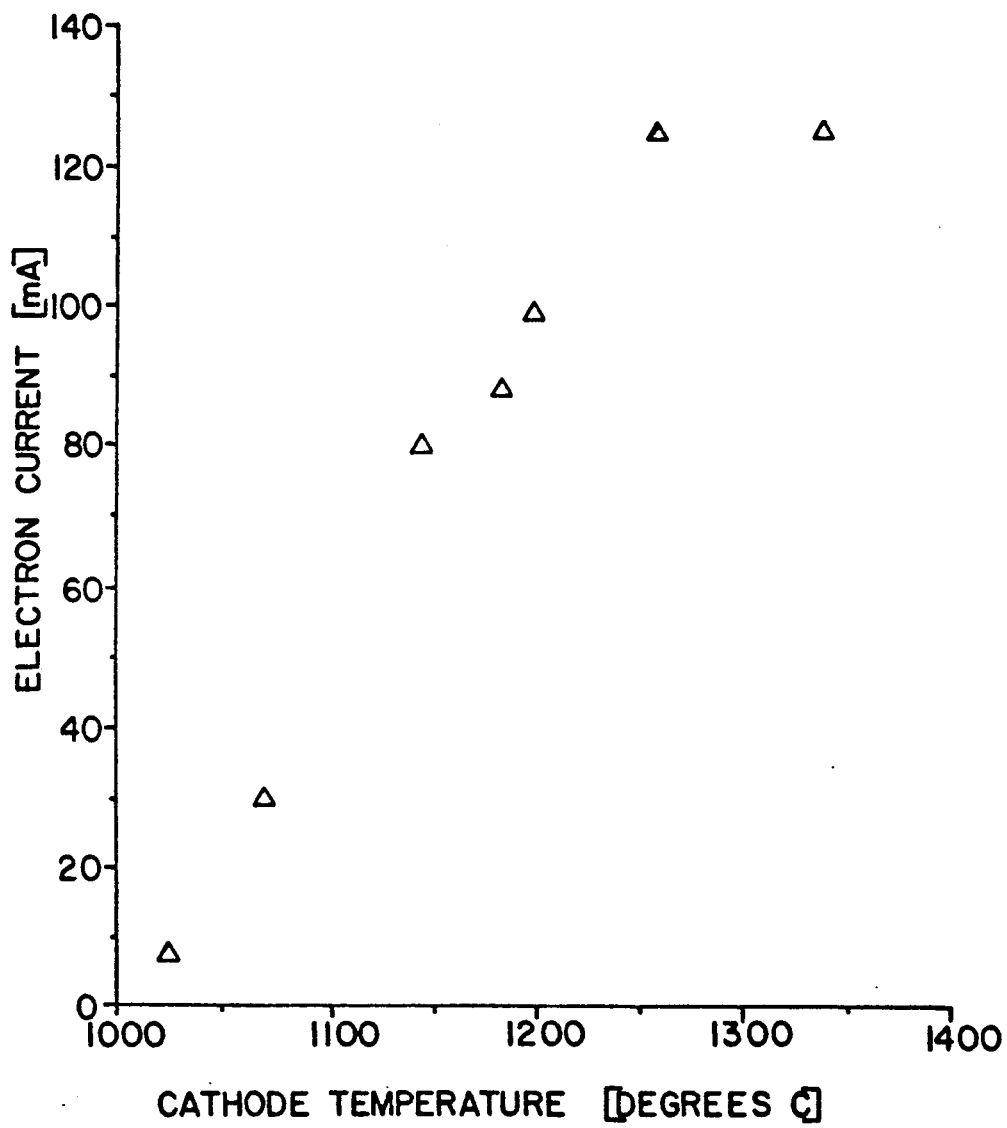
FIG. 7 is a graph of electron current as a function of cathode temperature for the apparatus of FIG. 5.

The cathode 104 is directly heated by passing heater current from supply 112 through the lanthanum hexaboride cathode material. The temperature on the surface of cathode 104 was monitored by an optical pyrometer. A plot of collected electron current as a function of cathode temperature with the extraction voltage maintained at about 54 volts and a xenon pressure of $5 \times 10^{-5}$ torr is shown in FIG. 7. A total electron current of 100 milliamps or higher is obtained when the cathode temperature exceeds 1300° C.

Figure 8:
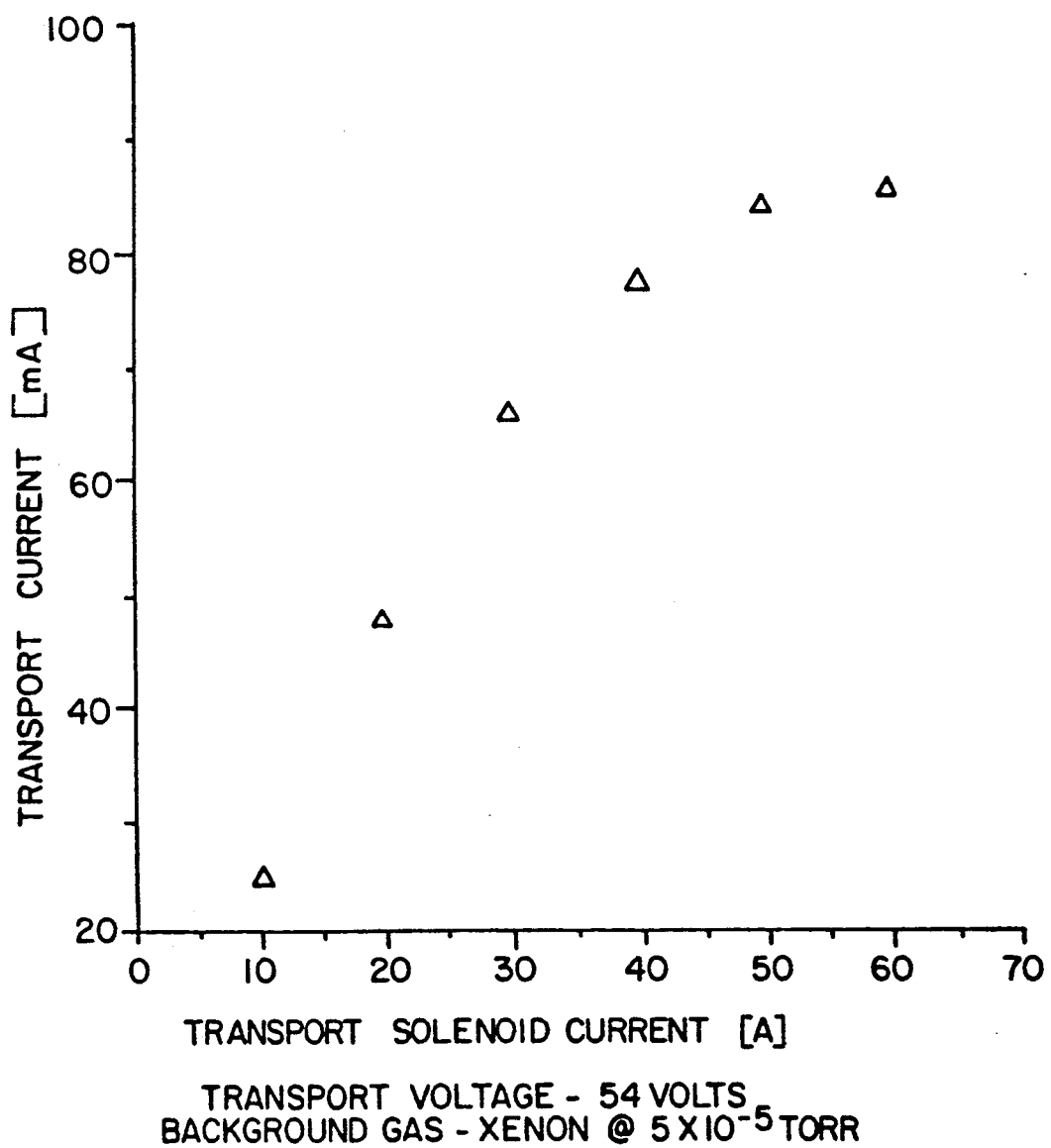
FIG. 8 is a graph of electron current as a function of solenoid current for the apparatus of FIG. 5.

A plot of the collected electron current as a function of current in steering coil 110 is shown in FIG. 8. In this measurement, the extraction voltage was maintained at 54 volts and the xenon gas pressure was $5 \times 10^{-5}$ torr. A steering coil current of about 60 amps is preferred and provides a generally uniform beam profile at the target 108.

In order to measure the energy distribution of the collected electrons, a small, plane Langmuir probe was positioned in front of the target 108. The measurement indicated that the majority of the electrons arriving at the target 108 have energies less than 10 electron volts.

Figure 9:
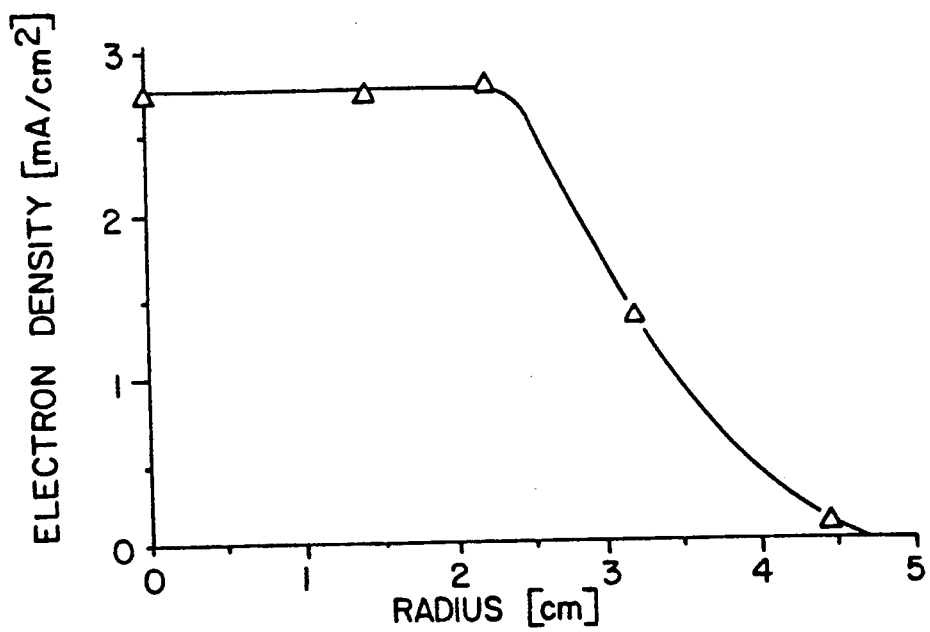
FIG. 9 is a graph of electron density as a function of radial position in the apparatus of FIG. 3.

A measurement of a right angle steering coil, as shown in FIG. 3, is plotted in FIG. 9. The electron current density is plotted as a function of radial position. In this measurement, an extraction voltage of 30.8 volts was used to provide a total electron current of 96.2 milliamps. The transport field provided by the steering coil 50 was 32 gauss, and the steering field provided by coils 74 and 76 was 5 gauss. The electron current density at the collector was very uniform within a 5 centimeter diameter, as shown by FIG. 9. Langmuir probe measurements of the configuration of FIG. 3 indicated that the majority of electrons impinging on the target had energies of less than 10 electron volts.

In summary, the configuration shown in FIG. 3 and described hereinabove provides a total electron current at the target wafer on the order of 100 milliamps. Positive ions are required for low voltage extraction and to provide space charge neutralization. The majority of electrons reaching the wafer have energies of less than 10 electron volts. The electrons have a distribution that is uniform over a region that is approximately equal in diameter to the cathode. The electron source can be positioned to prevent a direct line of sight between the cathode and the target wafer 14, and the magnetic field provides efficient transport of electrons from the electron source to the target wafer.

Figure 10A:
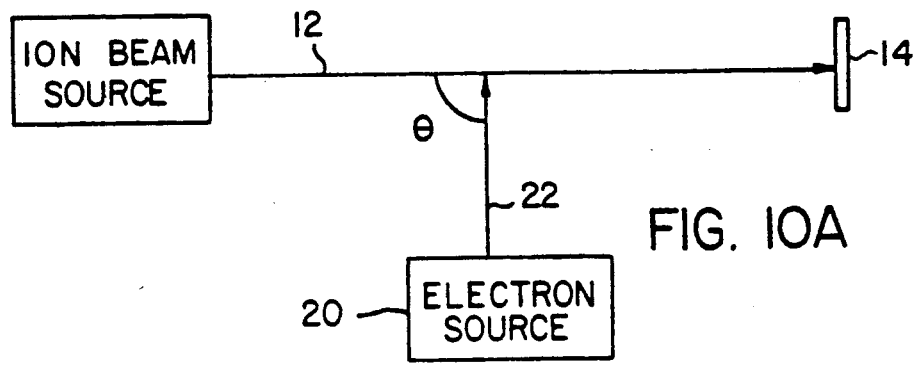
FIGS. 10A-10C are schematic diagrams showing different angles of intersection between the electron beam and the ion beam.
Figure 10B:
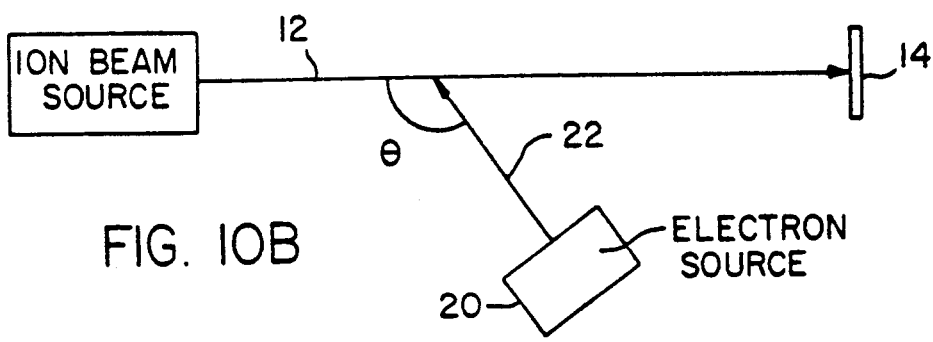
Figure 10C:
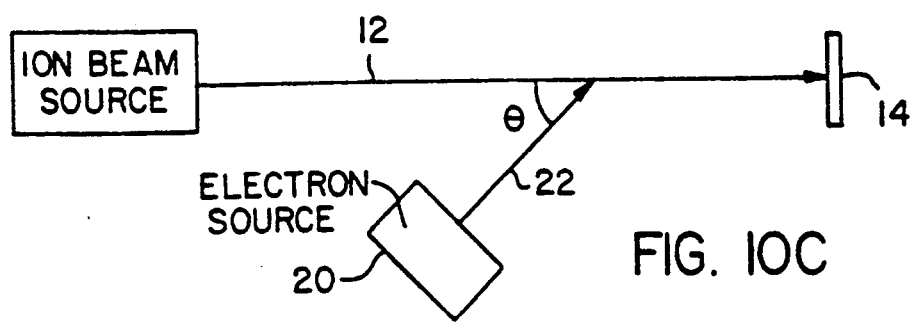

The examples shown in FIGS. 1, 3 and 4 and described hereinabove employ an angle of intersection between the electron beam 22 and the ion beam 12 of approximately 90°. In accordance with the present invention, the angle of intersection between the electron beam 22 and the ion beam 12 can be in a range from slightly greater than 0° to slightly less than 180°. An angle $\theta$ of the intersection between electron beam 22 and ion beam 12 of 90° is shown in FIG. 10A. This corresponds to FIGS. 1, 3 and 4. In FIGS. 10A-10C, the magnetic means for guiding the electron beam 22 to the target wafer 14 has been omitted for simplicity. It will be understood that the magnetic means typically includes a steering coil which extends from the electron source 20 to the path of ion beam 12 and then extends along the path of ion beam 12 to wafer 14. The electron beam 22 follows a curved path near the intersection with ion beam 12 rather than an abrupt change in direction as shown schematically in FIGS. 10A-10C. The angle $\theta$ is used to approximate the change in direction of the electron beam 22 when it intersects the ion beam 12.

In FIG. 10B, the angle $\theta$ of intersection between the electron beam 22 and the ion beam 12 is greater than 90°. The angle $\theta$ can be as great as slightly less than 180°. Angles $\theta$ greater than 90° have the advantage that contaminants and heat generated by electron source 20 are directed generally away from wafer 14. Since there is no direct line of sight between the cathode of the electron source 20 and the wafer 14, the tendency for contaminants and heat from the electron source to reach the wafer is reduced. Furthermore, the average energy of the electrons in the electron beam is reduced by collisions with any gas atoms that may be present over the relatively long electron beam path length between the electron source and the wafer. As discussed above, a gas may be introduced into the vacuum chamber to assist in transporting the electron beam to the wafer. If desired, a Faraday system can be biased at a small negative voltage, on the order of about 5 volts, to assist in keeping low energy electrons in ion beam 12.

In FIG. 10C, the angle $\theta$ of intersection between electron beam 22 and ion beam 12 is less than 90°. The angle $\theta$ can be as small as slightly greater than 0°. Angles $\theta$ of less than 90° provide the advantage that the electron beam 22 is more nearly directed at wafer 14 so that fewer electrons are lost during transport, and a higher electron current reaches wafer 14. However, the configuration of FIG. 10C provides a higher likelihood that contaminants and heat from electron source 20 will reach wafer 14.

In summary, the angle $\theta$ of intersection between electron beam 22 and ion beam 12 can be selected from a range of slightly greater than 0° to slightly less than 180°. Preferably, the angle $\theta$ is in a range of angles from about 90° to slightly less than 180° for the reasons discussed above.

Figure 11:
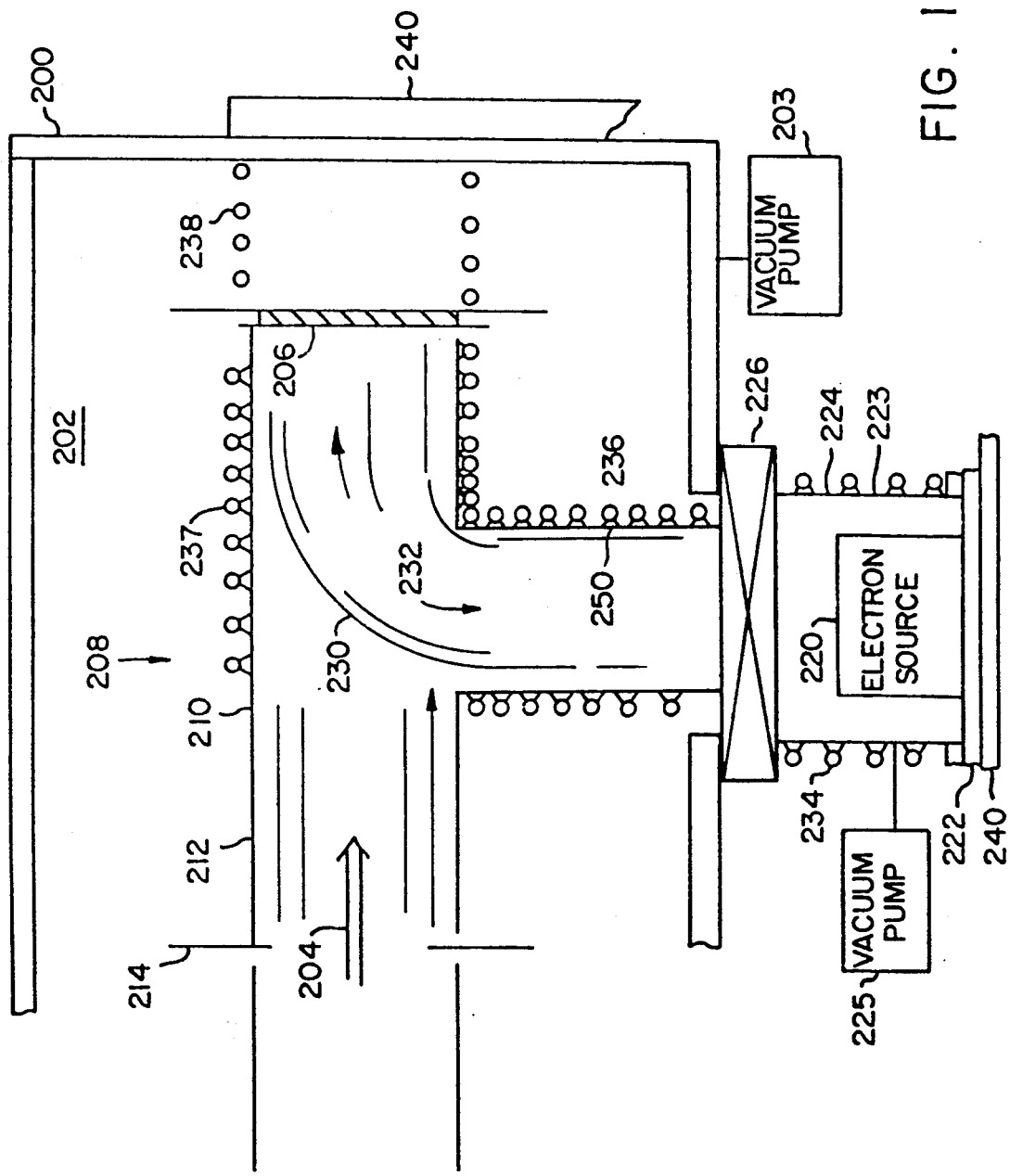
FIG. 11 is a partial cross-sectional view of a preferred embodiment of an ion implantation system in accordance with the present invention.

A practical embodiment of an ion implantation system in accordance with the present invention is shown in FIG. 11. A vacuum chamber 200 defines a high vacuum region 202. The vacuum chamber 200 is evacuated by a conventional vacuum pumping system 203. An ion beam 204 is directed from an ion source (not shown) to a target 206. The target 206 is typically a semiconductor wafer. The ion beam 204 passes through a Faraday charge measurement system 208 including a Faraday cage 210, a bias ring 212 and a ground mask 214. The Faraday system permits accurate measurement of the ion current applied to target 206. Faraday systems are generally known in the art.

An electron source 220 is mounted to a frame member 222 located outside vacuum chamber 200. The electron source 220 is enclosed in a vacuum housing 223 including a wall 224 and frame member 222. The vacuum housing 223 is evacuated by a vacuum pump 225 and is selectively connected to high vacuum region 202 by a gate valve 226. When the gate valve 226 is closed, electron source 220 is isolated from vacuum region 202. When gate valve 226 is open, the vacuum housing 223 us directly connected to high vacuum region 202, and electron source 220 can direct an electron beam into high vacuum region 202. In order to permit accurate charge measurement by the Faraday system 208, the electron source 220 is electrically isolated from vacuum chamber 200. This can be accomplished by an isulated mounting of gate valve 226 to vacuum chamber 200. All parts of the charge neutralization apparatus are electrically referenced to the Faraday system in order to prevent dose measurement errors.

The location of the electron source 220 as shown in FIG. 11 provides several advantages in the operation of the ion implantation system. When servicing or replacement of the electron source 220 is required, the gate valve 226 is closed, and the electron source 220 can be serviced without interrupting the vacuum in high vacuum region 202. Furthermore, since the electron source 220 is positioned well away from target 206, contaminants and heat generated by electron source 220 are unlikely to affect target 206. The magnetic means described above permits the electron 230 to be transported from the electron source 220 to target 206 without appreciable loss of electrons. The electron source 220 can be mounted in a location that facilitates servicing. By contrast, prior art electron sources used for neutralization were required to be mounted in close proximity to the ion beam or to the target.

An electron beam 230 is directed by the electron source 220 into Faraday cage 210 through an opening 232. The electron beam 230 is magnetically guided to the target 206 by a magnetic means including a first steering coil 234 which surrounds the vacuum housing 223, a second steering coil 236 which extends from the region of gate valve 226 to Faraday cage 210, a third steering coil 237 which surrounds Faraday cage 210 and extends from opening 232 to target 14, a fourth steering coil 238 which extends from target 206 to the wall of vacuum chamber 200, and a magnetically permeable yoke 240 which extends from vacuum chamber 200 in the region of coil 238 to the first steering coil 234. The magnetic means provides a generally axial magnetic field along substantially the entire length of the electron beam path between electron source 220 and target 206.

The second steering coil 236 surrounds a nonmagnetic tube 250. The nonmagnetic tube 250 extends from a region adjacent to electron source 220 to the opening 232 in Faraday cage 210. The tube 250 is sealed to Faraday cage 210 to prevent loss of charges, which would adversely affect the charge measurement. The magnetic means preferably includes means, such as Helmholtz coils (not shown in FIG. 11 but shown in FIGS. 3 and 4 and described hereinabove), for producing a transverse magnetic field in the region of the intersection between electron beam 230 and ion beam 204. The transverse magnetic field assists in guiding the electron beam 230 to target 206. In FIG. 11, the Helmholtz coils are positioned above and below the Faraday cage 210 adjacent to opening 232, the region where the electron beam 230 is guided into and parallel with the path of the ion beam 204. It will be understood that the tube 250 and the Faraday cage 210 must be fabricated of a nonmagnetic material such as aluminum. The yoke 240, which is shown broken away in FIG. 11 for simplicity, can have any convenient configuration which provides a return path for magnetic field lines generated by steering coils 234, 236, 237 and 238.

In accordance with a further aspect of the invention, a cooling arrangement is provided for the steering coils 234, 236 and 237. In a preferred embodiment, the steering coils 234, 236 and 237 comprise copper tubes, and means are provided for circulating a cooling fluid through the copper tubes. The cooling fluid is preferably deionized water. The turns of second steering coil 236 are thermally connected to tube 250; the turns of steering coil 237 are thermally connected to Faraday cage 10; and the turns of steering coil 234 are thermally connected to wall 224. When the tube 250 is an electrically conductive material such as aluminum, the thermal connection between the steering coil 236 and tube 250 must be electrically insulating. Examples of suitable materials are thermally conductive silicone rubber and thermally conductive epoxy. The tube 250 and Faraday cage 210 constitute part of the cooling system and conduct heat away from the magnetic means.

The cooling arrangement shown in FIG. 11 permits dissipation of thermal energy radiating from electron source 220 which could otherwise reach target 206. As indicated above, the electron source 220 is typically operated at temperatures up to 1400° K. Cooling of semiconductor wafers irradiated with high current ion beams in vacuum is a difficult task, even in the absence of thermal energy from an electron source. Thus, it is advantageous to remove as much of the thermal energy as possible. A further advantage of the cooling arrangement shown in FIG. 11 and described above is that the cooled surfaces of tube 250 and Faraday cage 210 act as a getter for condensation of materials emitted from the cathode of electron source 220 and copper emitted from the steering coils, thereby reducing the possibility of target contamination.

Figure 12:
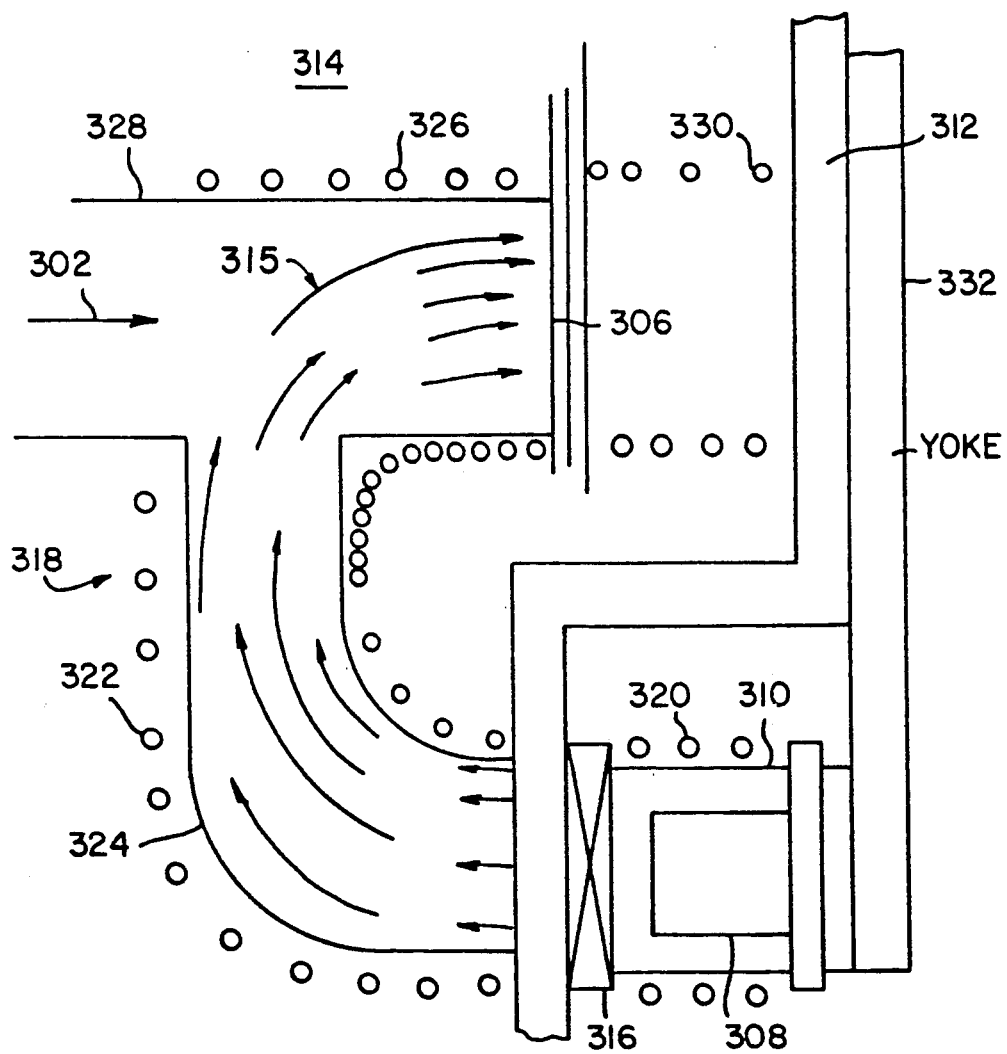
FIG. 12 is a partial cross-sectional view of another preferred embodiment of the invention.

An alternate ion implantation system configuration is shown in FIG. 12. An ion beam 302 is directed toward a target 306. An electron source 308 is mounted in a vacuum housing 310. A vacuum chamber 312 encloses a high vacuum region 314 which extends from an ion source (not shown) to the target 306. A gate valve 316 selectively isolates electron source 308 from high vacuum region 314. An electron beam 315 is directed by electron source 308 into high vacuum region 314 and is guided to target 306 by a magnetic guiding means 318. The magnetic guiding means 318 includes a first steering coil 320 surrounding vacuum housing 310, a second steering coil 322 surrounding a guide tube 324, a third steering coil 326 surrounding a Faraday cage 328, a fourth steering coil 330 extending from target 306 to a wall of vacuum chamber 312, and a magnetically permeable yoke 332 extending from steering coil 330 to steering coil 320.

The initial direction of electron beam 320 as emitted from electron source 308 is opposite the direction of ion beam 302. The electron beam 320 is guided by the steering coils through a 180° reversal in direction to target 306. The configuration of FIG. 12 minimizes the possibility that contaminants and heat from electron source 308 will reach target 306. The electron source 308 is positioned for ease of servicing and for ease of mounting on the vacuum chamber 312. The coiling means shown in FIG. 11 and described hereinabove is preferably utilized in the configuration of FIG. 12. The electron source 220 of FIG. 11 and the electron source 308 of FIG. 12 preferably utilize a large area lanthanum hexaboride cathode as described above in connection with FIG. 2.

The present invention provides a large area, high current electron beam of low energy electrons for neutralization of a workpiece such as a semiconductor wafer. The electron source can be positioned at a remote location, such as external to the main vacuum chamber, for ease of servicing. The remote location also provides advantages of removing a source of thermal energy and contaminants from the region of the semiconductor wafer. The electron beam is magnetically guided from the remote electron source to the wafer without significant loss of electrons.

While there have been shown and described what are at present considered the preferred embodiments of the present invention, it will be obvious to those skilled in the art that various changes and modifications may be made therein without departing from the scope of the invention as defined by the appended claims.

What is claimed is:

1. Apparatus for neutralization of a workpiece in a system wherein a beam of positive ions is applied to the workpiece, comprising:
   an electron source for generating an electron beam having a relatively large cross-sectional area; and
   p1 means for transporting said electron beam from said electron source to said workpiece so as to provide substantially uniform distribution of said electron beam over said workpiece, said means for transporting comprising magnetic means for generating a magnetic field along a prescribed electron beam path between said electron source and said workpiece for guiding said electron beam to said workpiece, said magnetic field having an axial component parallel to said electron beam path along substantially the entire length of said electron beam path, and a supply of positive ions along said electron beam path for space charge neutralization of said electron beam.

2. Apparatus as defined in claim 1 wherein said magnetic means includes a steering coil extending generally between said electron source and said workpiece for generating said axial component of magnetic field.

3. Apparatus as defined in claim 1 wherein said magnetic means comprises a steering coil including a generally helical conductor surrounding said electron beam and means for providing an electrical current through said steering coil for generating an axial component of said magnetic field generally parallel to said beam path.

4. Apparatus as defined in claim 3 wherein said steering coil includes a first section and a second section, said steering coil having an opening between said first and second sections for receiving said ion beam, said electron beam and said ion beam being coincident in said second section.

5. Apparatus as defined in claim 4 wherein said steering coil extends from a region adjacent to said electron source to a region adjacent to said workpiece.

6. Apparatus as defined in claim 4 wherein said magnetic means further includes means for generating a transverse component of said magnetic field in an elbow region between said first and second sections that is perpendicular to said electron beam.

7. Apparatus as defined in claim 6 wherein said means for generating a tranverse components of said magnetic field comprises coil means positioned above and below said elbow region.

8. Apparatus as defined in claim 7 wherein said magnetic means further includes first and second trim coils in said elbow region between said first and second sections for modifying the axial component of said magnetic field, said first trim coil having a plane perpendicular to said ion beam and said second trim coil having a plane parallel to said ion beam.

9. Apparatus as defined in claim 7 wherein said magnetic means further includes a magnetically permeable element between said workpiece and said electron source for completing a magnetic circuit with said steering coil.

10. Apparatus as defined in claim 1 wherein the electrons in said electron beam have energies of 30 electron volts or less.

11. Apparatus as defined in claim 1 wherein said electron source comprises a large area cathode and means for extracting low energy electrons from said cathode.

12. Apparatus as defined in claim 11 wherein said cathode comprises lanthanum hexaboride.

13. Apparatus as defined in claim 10 wherein said magnetic field has an axial component in the direction of said electron beam less than 100 gauss.

14. Apparatus as defined in claim 12 wherein said cathode has an area that is approximately equal to the area of the workpiece.

15. A method for neutralization of a workpiece in a system wherein a beam of positive ions is applied to the workpiece, said method comprising the steps of:
   generating an electron beam having a relatively large cross-sectional area with an electron source; and
   transporting said electron beam from said electron source to said workpiece so as to provide substantially uniform distribution of said electron beam over said workpiece, the step of transporting said electron beam including generating a magnetic field along a prescribed electron beam path between said electron source and said workpiece for guiding said electron beam to said workpiece, said magnetic field having an axial component parallel to said electron beam path along substantially the entire length of said electron beam path, and providing a supply of positive ions along said electron beam path for space charge neutralization of said electron beam.

16. A method as defined in claim 15 wherein the step of generating a magnetic field includes providing a steering coil extending generally between said electron source and said workpiece for generating said axial component of magnetic field.

17. A method as defined in claim 16 wherein said electron beam path includes a first section and a second section that are generally perpendicular to each other, said first and second sections intersecting in an elbow region, and wherein the step of generating a magnetic field further includes the step of generating a transverse component of said magnetic field perpendicular to said electron beam path in said elbow region.

18. A method as defined in claim 15 wherein the step of generating an electron beam includes extracting low energy electrons from a large area lanthanum hexaboride cathode with an extraction grid positioned in close proximity to said cathode.

19. Ion implantation apparatus comprising:
means for generating a beam of positive ions for treatment of a semiconductor wafer;
an electron source for generating an electron beam having a relatively large cross-sectional area; and
means for transporting said electron beam from said electron source to said semiconductor wafer so as to provide substantially uniform distribution of said electron beam over said semiconductor wafer, said means for transporting comprising magnetic means for generating a magnetic field along a prescribed electron beam path between said electron source and said semiconductor wafer for guiding said electron beam to said semiconductor wafer, said magnetic field having an axial component parallel to said electron beam path along substantially the entire length of said electron beam path, and a supply of positive ions along said electron beam path for space charge neutralization of said electron beam.

20. Ion implantation apparatus as defined in claim 19 wherein said magnetic means comprises a steering coil including a generally helical conductor surrounding said electron beam and means for providing an electrical current through said steering coil for generating said axial component of said magnetic field generally parallel to said beam path.

21. Ion implantation apparatus as defined in claim 20 wherein said steering coil includes a first section and a second section, said steering coil having an opening between said first and second sections for receiving said ion beam, said electron beam and said ion beam being coincident in said second section.

22. Ion implantation apparatus as defined in claim 21 wherein said steering coil extends from a region adjacent to said electron source to a region adjacent to said workpiece.

23. Ion implantation apparatus as defined in claim 21 wherein said magnetic means further includes means for generating a transverse component of said magnetic field in an elbow region between said first and second sections that is perpendicular to said electron beam.

24. Ion implantation apparatus as defined in claim 23 wherein said means for generating a transverse component of said magnetic field comprises coil means positioned above and below said elbow region.

25. Ion implantation apparatus as defined in claim 19 wherein said electron source comprises a large area cathode and means for extracting low energy electrons from said cathode.

26. Ion implantation apparatus as defined in claim 25 wherein said cathode comprises lanthanum hexaboride.

27. Ion implantation apparatus comprising:
means for generating an ion beam of positive ions and for directing the ion beam along an ion beam path to a semiconductor wafer;
an electron source for generating an electron beam having a relatively large cross-sectional area;
means for transporting said electron beam from said electron source to said semiconductor wafer so as to provide substantially uniform distribution of said electron beam over said semiconductor wafer, said means for transporting comprising magnetic means for generating a magnetic field along a prescribed electron beam path between said electron source and said semiconductor wafer for guiding said electron beam to said semiconductor wafer, said magnetic field having an axial component parallel to said electron beam path along substantially the entire length of said electron beam path, and a supply of positive ions along said electron beam path for space charge neutralization of said electron beam,
a vacuum chamber enclosing said ion beam path, said electron beam path and said semiconductor wafer, said vacuum chamber defining a high vacuum region; and
means for vacuum pumping of said vacuum chamber.

28. Ion implantation apparatus as defined in claim 27 wherein said electron source is remotely located from said ion beam path, and further including means for selectively isolating said electron source from said high vacuum region.

29. Ion implantation apparatus as defined in claim 28 wherein said means for selectively isolating said electron source includes vacuum valve means positioned between said electron source and said high vacuum region.

30. Ion implantation apparatus as defined in claim 29 wherein said magnetic means comprises a steering coil including a generally helical conductor surrounding said electron beam and means for providing an electrical current through said steering coil.

31. Ion implantation apparatus as defined in claim 27 wherein said ion beam and said electron beam intersect at an angle in a range from slightly greater than 0° to slightly less than 180°.

32. Ion implantation apparatus as defined in claim 27 wherein said ion beam and said electron beam intersect at an angle in a range from about 90° to slightly less than 180°.

33. Ion implantation apparatus comprising:
means for generating an ion beam of positive ions and for directing the ion beam along an ion beam path to a semiconductor wafer;

an electron source for generating an electron beam;

magnetic means for generating a magnetic field along a prescribed electron beam path between said electron source and said semiconductor wafer for guiding said electron beam to said semiconductor wafer, said magnetic field having an axial component parallel to said electron beam path along substantially the entire length of said electron beam path;

a vacuum chamber enclosing said ion beam path, said electron beam path and said semiconductor wafer, said vacuum chamber defining a high vacuum region; and means for vacuum pumping of said vacuum chamber, said ion beam and said electron beam intersecting at an angle in a range from greater than 90° to slightly less than 180° such that contaminants from the electron source are directed away from the semiconductor wafer.

34. Ion implantation apparatus as defined in claim 27 further including cooling means disposed along said electron beam path for removing thermal energy generated by said electron source and for condensing materials emitted by said electron source.

35. Ion implantation apparatus as defined in claim 34 wherein said magnetic means comprises a steering coil including a generally helical conductor surrounding said electron beam and means for providing an electrical current through said steering coil.

36. Ion implantation apparatus as defined in claim 35 wherein said steering coil comprises a tubular conductor and wherein said cooling means comprises means for circulating a cooling fluid through said tubular conductor.

37. Ion implantation apparatus as defined in claim 36 wherein cooling means further comprises a nonmagnetic tube located within said steering coil and thermally connected to said steering coil.

38. Ion implantation apparatus as defined in claim 27 further including a Faraday charge measurement system positioned between said means for generating an ion beam and said semiconductor wafer, said electron beam being guided into said Faraday charge measurement system.

39. Ion implantation apparatus as defined in claim 38 wherein said magnetic means comprises a steering coil including a generally helical conductor surrounding said electron beam and means for providing an electrical current through said steering coil.

40. Ion implantation apparatus as defined in claim 39 further including cooling means disposed along said electron beam path for removing thermal energy generated by said electron source and for condensing materials emitted by said electron source.

41. Ion implantation apparatus as defined in claim 40 wherein said cooling means comprises a nonmagnetic, thermally conductive tube located within said steering coil and thermally connected to said steering coil, said thermally conductive tube extending from a region adjacent to said electron source to said Faraday charge measurement system.

42. Ion implantation apparatus as defined in claim 41 wherein said steering coil comprises a tubular conductor and wherein said cooling means comprises means for circulating a cooling fluid through said tubular conductor.

43. Ion implantation apparatus as defined in claim 27 wherein said electron source comprises a large area cathode and means for extracting low energy electrons from said cathode.

44. Ion implantation apparatus as defined in claim 43 wherein said cathode comprises lanthanum hexaboride.

45. Ion implantation apparatus as defined in claim 27 wherein said magnetic means further includes means for generating a tranverse component of said magnetic field in an elbow region where said electron beam intersects said ion beam, said transverse component being perpendicular to said electron beam and said ion beam.

46. Ion implantation apparatus as defined in claim 45 wherein said means for generating a transverse component of said magnetic field comprises Helmholtz coils positioned on opposite sides of said ion beam.

47. Ion implantation apparatus as defined in claim 43 wherein said large area cathode has an area that is approximately equal to the area of the semiconductor wafer.

48. Ion implantation apparatus as defined in claim 27 wherein said electron source generates an electron beam having a current of up to 100 milliamps.

* * * * *